United States Patent [19]
Nakajima

[11] Patent Number: 5,446,296
[45] Date of Patent: Aug. 29, 1995

[54] SEMICONDUCTOR DEVICE

[75] Inventor: Shigeru Nakajima, Yokohama, Japan

[73] Assignee: Sumitomo Electric Industries, Ltd., Japan

[21] Appl. No.: 383,653

[22] Filed: Feb. 3, 1995

Related U.S. Application Data

[63] Continuation of Ser. No. 31,965, Mar. 16, 1993, abandoned.

[30] Foreign Application Priority Data

Mar. 23, 1992 [JP] Japan .................. 4-064831
Mar. 23, 1992 [JP] Japan .................. 4-064833

[51] Int. Cl.[6] ............................. H01L 29/80
[52] U.S. Cl. ......................... 257/194; 257/280; 257/285; 257/287; 257/472
[58] Field of Search ............. 257/194, 472, 280, 285, 257/287

[56] References Cited

U.S. PATENT DOCUMENTS 4,814,836  3/1989  Thompson ............... 257/194
5,012,301  4/1991  Xu et al. ................. 257/472
5,023,674  6/1991  Hikosaka et al. ........ 257/24
5,151,757  9/1992  Enoki et al. ............. 257/194

FOREIGN PATENT DOCUMENTS 3629680  3/1988  Germany .

OTHER PUBLICATIONS

Japanese Patent Abstract for Japaneses Laid-Open Patent Application No. JP-A-11 83 859, published Jul. 21, 1989, entitled "Hetero-Junction Field Effect Tansistor", by Shigeru Nakajima, Abstract vol. 13, No. 468 (E-834) (3816) dated Oct. 23, 1989.
"Influence of the Well Composition and Thickness in the GaInP/InP/GaInP Structure for Hemt", Indium Phosphide and Related Materials, Apr. 1991, Caridd, Wales, UK, pp. 434–437, XP 239081 S. Loualiche, et al.
"High-Performance InAlAs/InGaAs Hemt's and MESFET's" IEEE Electron Device Letters; vol. 9, No. 7, Jul. 1988, pp. 328–330, A. Fathimulla, et al.

Primary Examiner—Edward Wojciechowicz
Attorney, Agent, or Firm—Beveridge, DeGrandi, Weilacher & Young

[57] ABSTRACT

In this MESFET, an undoped AlInAs layer 120, an undoped InP layer 130, an n-InGaAs layer 140, an undoped InP layer 150, and an AlInAs layer 160 are formed on a semi-insulating InP substrate 110. A source electrode 410, a drain electrode 430, and a gate electrode 420 are formed on the AlInAs layer 160. The source electrode 410 and the drain electrode 430 are in ohmic contact with the AlInAs layer 160, and the gate electrode 420 forms a Schottky junction with the AlInAs layer 160.

29 Claims, 7 Drawing Sheets

SEMICONDUCTOR DEVICE

This application is a continuation of application Ser. No. 08/031,965, filed Mar. 16, 1993, now abandoned, which application is entirely incorporated herein by reference.

BACKGROUND OF THE INVENTION

1. Field of the Invention

The present invention relates to an InP heterojunction field effect transistor structure.

2. Related Background Art

An n-InP/InGaAs heterojunction structure, an n-AlInAs/InGaAs heterojunction structure, and an n-AlInAs/InP heterojunction structure are known as an InP heterojunction field effect transistor.

For example, such a transistor is described in "High-Performance InAlAs/InGaAs HEMT's and MESFET's, IEEE ELECTRON DEVICE LETTER, Vol. 9, No. 7, July 1988". InGaAs has a high mobility in a low electric field, but a low mobility in a high electric field due to polar optical scattering. For this reason, even if a field effect transistor (FET) having a short gate length is formed, good characteristics cannot be obtained in a high electric field. A transistor having an n-AlInAs/InP heterojunction structure has an InP channel with a high electron saturation rate even in a high electric field. However, this transistor has a low mobility in a low electric field, thus posing problems in terms of FET characteristics.

In order to solve these problems, an FET described in Japanese Patent Application No. 63-9192 filed by the present inventor is proposed. This FET has advantages of both the conventional transistors described above and has a structure shown in FIG. 1. An undoped InP layer 320, an undoped InGaAs layer 330, an n-InP layer 340, an undoped InP layer 350, and an n-AlInAs layer 360 are sequentially formed on a semi-insulating InP substrate 110. Source and drain electrodes 410 and 430 are formed in ohmic contact with the n-AlInAs layer 360. A gate electrode 420 which forms a Schottky junction between the source and drain electrodes is formed on the n-AlInAs layer 360.

Figure 1:
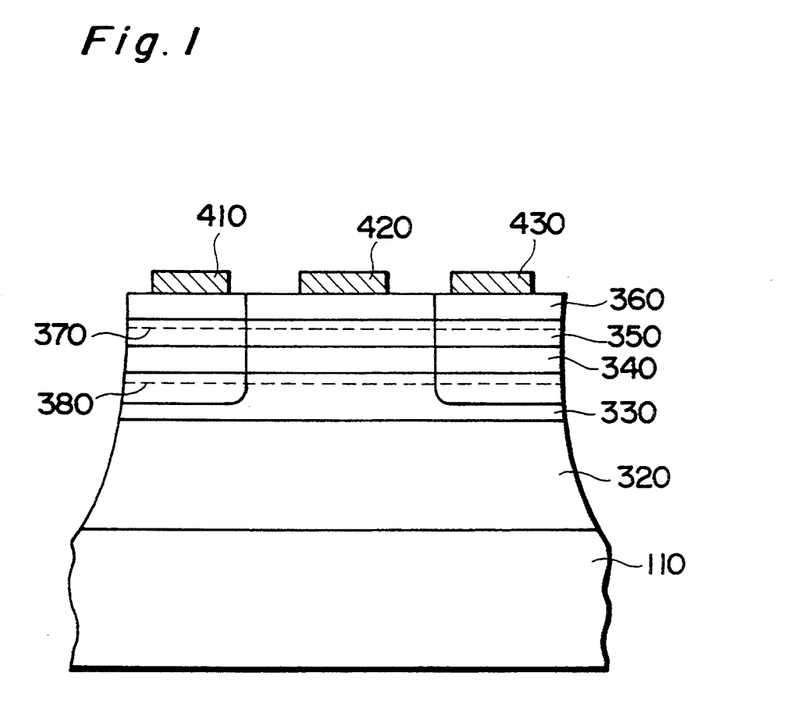
FIG. 1 is a sectional view showing a conventional structure.

An experiment was conducted using a transistor sample in which each of the n-InP layer 340 and the undoped InP layer 350 had a carrier concentration of $3 \times 10^{17}/cm^3$ and a thickness of 100 nm and the n-AlInAs layer 360 had a carrier concentration of $3 \times 10^{17}/cm^3$ and a thickness of 500 nm.

In this FET, two two-dimensional electron gases 370 and 380 are formed near the interfaces of the undoped InGaAs layer 330 and the undoped InP layer 350. The electron gas dominantly travels on the side of the undoped InGaAs layer 330 in a low electric field. However, the electron gas dominantly travels on the side of the undoped InP layer 350 in a high electric field. Therefore, a large drain current is obtained, and a high driving capacity can be obtained.

In this FET, the present inventor conducted an experiment such that the n-InP layer 340 and the undoped InP layer 350 had a carrier concentration of $2 \times 10^{18}/cm^3$ each and thicknesses of 30 nm and 10 nm, respectively, the n-AlInAs layer 360 had a carrier concentration of $2 \times 10^{18}/cm^3$ and a thickness of 50 nm, and the undoped InGaAs layer 330 had a thickness of 10 nm. The present inventor found the following problems.

In this FET, the two two-dimensional electron gases 370 and 380 are formed and serve as channels. The two-dimensional electron gas 380 is farther spaced apart from the gate electrode 420 than the two-dimensional electron gas 370. For this reason, the drain current cutoff characteristics are degraded. In addition, the electron mobility must be set high, i.e., the source parasitic resistance must be reduced.

As described above, the conventional InP heterojunction field effect transistors pose problems on InP physical properties. No conventional InP heterojunction field effect transistor can sufficiently prevent degradation of InP physical properties.

SUMMARY OF THE INVENTION

It is, therefore, an object of the present invention to provide a field effect transistor capable of maintaining good InP characteristics in a high electric field, good drain current cutoff characteristics, and a high driving capacity. The semiconductor device (e.g., an FET and an IC incorporating such according to the present invention is characterized as comprising a channel layer constituted by an InGaAs layer having InP layers sandwiching this InGaAs layer, so that a channel serving as a current path between the drain and source is formed in this channel layer. A current flowing in the channel is controlled by a voltage applied to the gate electrode.

Mainly, two embodiments having different operating modes are envisioned in accordance with the impurity concentrations of InGaAs layers constituting the channel layers.

The first embodiment is characterized in that a channel layer comprises at least one undoped InGaAs layer and n-type InP layers sandwiching the undoped InGaAs layer.

The second embodiment is characterized in that a channel layer comprises at least one InGaAs layer containing an n-type dopant and InP layers sandwiching the InGaAs layer.

In these structures, a layer (e.g., AlInAs) for forming a potential barrier with respect to the AlInAs layer and the channel layer is preferably formed between the gate electrode and the channel layer so as to improve Schottky contact.

Each channel is preferably formed on a semi-insulating InP substrate, or InGaAs and InP layers preferably have appropriate thicknesses.

In the channel layer of a first semiconductor device according to the present invention, the two-dimensional electron gas channel constituted by electrons supplied from the upper n-InP layer to the undoped InGaAs layer and the two-dimensional electron gas channel constituted by the electrons supplied from the lower n-InP layer to the undoped InGaAs layer are formed. In a low electric field, the two two-dimensional electron gases each having a high mobility serve as a channel, and the electrons dominantly flow through this channel. On the other hand, in a high electric field, some electrons are subjected to real space transition and flow in the InP layers which have a high electron saturation rate. Since the InP layer has a high electron saturation rate, prolongation of average traveling time of the electrons flowing between the drain and the source can be suppressed, and the average traveling time is short regardless of the magnitude of the electric field. In this case, the layer formed on the undoped InGaAs layer can be made thin to reduce the distance between the gate and the channel.

If an AlInAs layer is additionally formed, a good Schottky junction is formed with the gate electrode.

If the layer for forming the potential barrier is additionally formed, electrons transited to the InP layer in a high electric field are prevented from being diffused outside the channel layer.

According to the present invention as described above, prolongation of average traveling time can be suppressed even in a high electric field. The average traveling time is short regardless of the magnitude of the electric field. For this reason, high-speed operation can be achieved and good frequency characteristics can also be obtained regardless of bias conditions. Since the distance between the gate and the channel can be reduced, good drain current cutoff characteristics can be obtained. The channel is a region having a high electron saturation rate, and the parasitic capacitance can be reduced. In addition, since the electrons flow in the channel constituted by the two two-dimensional electron gases, the current driving capacity can be increased.

In the channel layer of the second semiconductor device according to the present invention, the potential of the conduction band of the n-InGaAs layer is lower than that of the InP layer. For this reason, the electrons between the drain and the source (i.e., the channel) flow through the n-InGaAs layer when the electric field of the channel is low. However, in a high electric field, some electrons run over the barrier and flow into the InP layer. The n-InGaAs layer has a high electron mobility in a low electric field, and each InP layer has a high electron saturation rate. For this reason, prolongation of average traveling time of the electrons flowing through the channel is suppressed even in a high electric field. Therefore, the average traveling time is short regardless of the magnitude of the electric field.

The n-InGaAs layer can be made thin to a degree that the number of electrons moved to the InP layer cannot be ignored, and the distance between the gate electrode and the channel can be reduced. Even in this case, the average traveling time of the electrons flowing through the channel is sufficiently short. When a sufficiently high electron concentration is given, the current flowing through the channel at the Schottky junction with the gate electrode can be controlled, and a sufficiently high drain current can be obtained.

If an AlInAs layer is additionally formed, a good Schottky junction is formed with the gate electrode.

If the layer for forming the potential barrier is additionally formed, electrons transited to the InP layer in a high electric field are prevented from being diffused outside the channel layer.

According to the present invention as described above, the average traveling time is short regardless of the magnitude of the electric field. For this reason, a high-speed operation can be achieved and good frequency characteristics can also be obtained regardless of bias conditions. Since the distance between the gate and the channel can be reduced, good drain current cutoff characteristics can be obtained.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

DETAILED DESCRIPTION OF THE PREFERRED EMBODIMENTS

Preferred embodiments of the present invention will be described with reference to the accompanying drawings. The same reference numerals as in the conventional example denote the same parts in the embodiments, and a detailed description thereof will be omitted.

Figure 2:
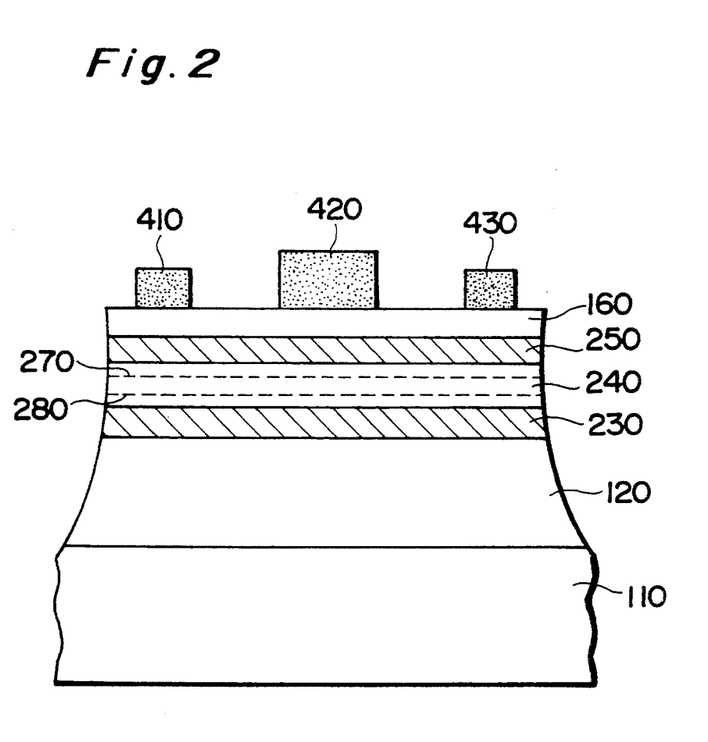
FIG. 2 is a sectional view showing a structure according to the first embodiment of the present invention.

FIG. 2 shows the structure of a heterojunction FET (HEMT) according to the first embodiment. In this FET, an undoped AlInAs layer 120, an n-InP layer 230, an undoped InGaAs ($In_xGa_{1-x}As$) layer 240, an n-InP layer 250, and an AlInAs layer 160 are formed on a semi-insulating InP substrate 110. A source electrode 410, a drain electrode 430, and a gate electrode 420 are formed on the AlInAs layer 160.

Figure 3A:
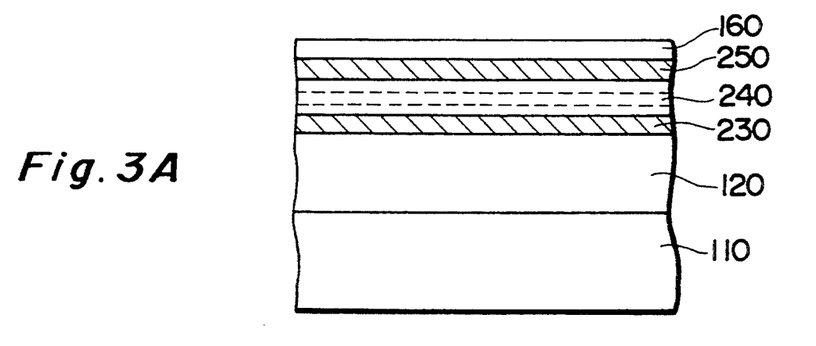
FIGS. 3A to 3C are sectional views for explaining the steps in manufacturing the structure of the first embodiment.

This heterojunction FET is manufactured by the steps in FIGS. 3A to 3C, as will be described below.

The undoped AlInAs layer 120 of an epitaxial layer, the n-InP layer 230, the undoped InGaAs layer 240, the n-InP layer 250, and the AlInAs layer 160 are sequentially grown on the semi-insulating InP substrate 110 in accordance with molecular beam epitaxy (MEB) or metal organic vapor phase epitaxy (MOVPE). The undoped AlInAs layer 120 has a thickness of 300 nm. The n-InP layer 230 has a thickness of 30 nm and a carrier concentration of $1 \times 10^{18}/cm^3$. The undoped InGaAs layer 240 has a thickness of 10 nm, and the n-InP layer 250 has a thickness of 40 nm and a carrier concentration of $2 \times 10^{18}/cm^3$. In this case, InGaAs is $In_{0.53}Ga_{0.47}As$ and has a small thickness such that the number of electrons moved to the InP layers 230 and 250 when the channel electric field is a high electric field cannot be ignored. InGaAs has an electron density large enough to obtain a sufficiently high drain current. The AlInAs layer 160 has a thickness of 15 nm (FIG. 3A).

Figure 3B:
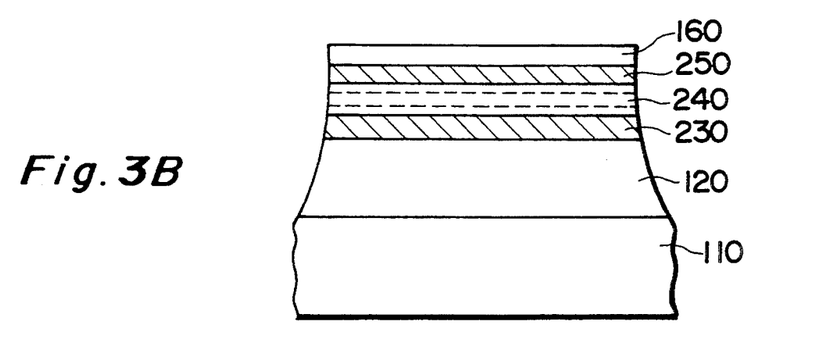
Figure 3C:
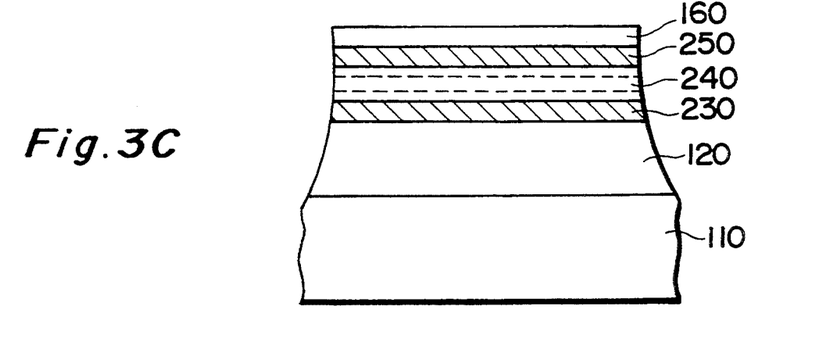

Mesa etching is performed using a resist as a mask to perform electrical isolation of active regions, i.e., isolation between the elements (FIG. 3B). A resist film is deposited on the entire surface and is patterned to form openings at locations corresponding to the prospective source and drain electrodes (this is performed by normal photolithography). Thereafter, AuGe/Ni (100 nm/30 nm) is vacuum-deposited and is lifted off using the resist pattern, thereby forming the source electrode 410 and the drain electrode 430 (FIG. 3C).

After a resist is deposited on the entire surface and is patterned to form an opening at a location corresponding to the prospective gate electrode, Ti/Pt/Au (30/10/300 nm) is vacuum-deposited. Thereafter, Ti/Pt/Au is lifted off using the pattern of the resist 15, thereby obtaining a heterojunction FET shown in FIG. 2.

In the FET shown in FIG. 2, the source electrode 410 and the drain electrode 430 are in ohmic contact with the AlInAs layer 160, and the gate electrode 420 forms a Schottky junction with the AlInAs layer 160. The undoped AlInAs layer 120 forms a heterobarrier with respect to the InP layer 230 to prevent electrons from leaking from the InP layer 230 to the semi-insulating InP substrate 110. InP is a material which hardly forms a good Schottky junction. For this reason, the AlInAs layer 160 is formed to form a good Schottky junction with the gate electrode 420.

Figure 4A:
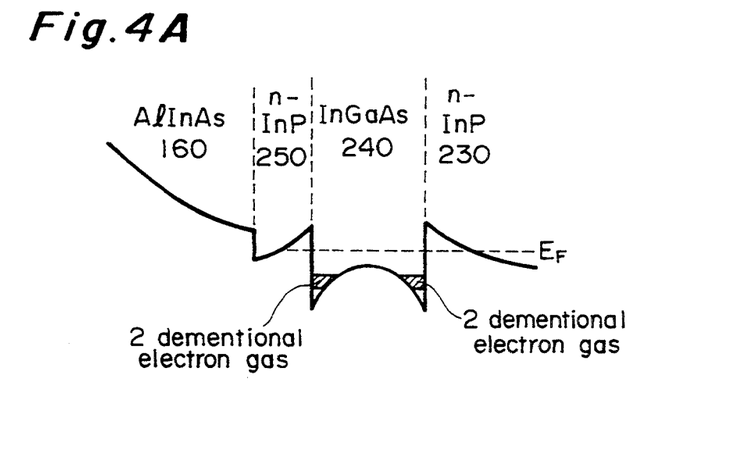
FIGS. 4A and 4B are potential diagrams near the channel.
Figure 4B:
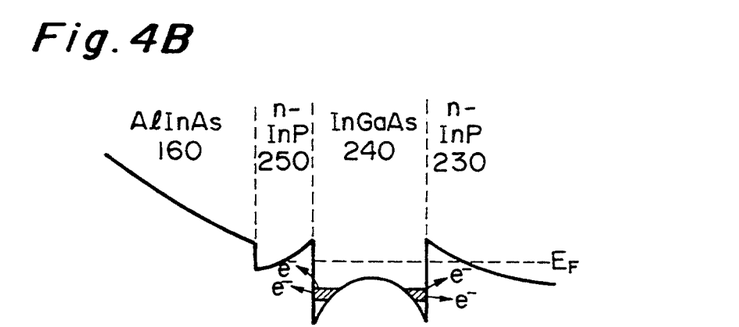

The band structure of the conduction bands of the n-InP layer 230, the undoped InGaAs layer 240, and the n-InP layer 250 is a structure having heterointerfaces shown in FIGS. 4A and 4B. A heterointerface is formed in the undoped AlInAs layer 120 between the n-InP layers 230 and 250, and two-dimensional electron gas channels 270 and 280 are formed by electrons supplied from the n-InP layers 230 and 250. A current flowing through the two-dimensional electron gas channels 270 and 280 is a dominant current flowing between the drain and the source in a low electric field (FIG. 4A). In a high electric field, some electrons of this current run over the barrier and are moved to the InP layers 230 and 250. These electrons flow in the InP layers 230 and 250 (FIG. 4B). Since the two-dimensional electron gas channels 270 and 280 and the InP have a high electron saturation density, the average traveling time is short in a low electric field. Even if some electrons flow in the InP layers 230 and 250 in a high electric field, prolongation of the average traveling time can be suppressed. That is, the average traveling time is short regardless of the magnitude of the electric field. Therefore, a high-speed operation can be performed and good frequency characteristics can be obtained regardless of biasing conditions.

Since the two two-dimensional electron gas channels 270 and 280 are formed, the current driving capacity can be increased, and a higher power can be processed. In particular, in a low electric field, since a current flows in the two-dimensional electron gas channels 270 and 280 of the undoped AlInAs layer 120 having a high electron mobility, the source parasitic resistance is reduced.

When the substrate 110 consists of InP, it has good lattice matching with InGaAs. In addition, since InP has a low thermal resistance, the substrate 110 has an advantage in heat dissipation.

Since the n-InP layer 250 and the AlInAs layer 160 near the surface are thin (½ the conventional case), the distances between the gate electrode 420 and the two-dimensional electron gas channels 270 and 280 (i.e., particularly, the distance between the gate electrode 420 and the two-dimensional electron gas channel 280) becomes short, thereby obtaining good cutoff characteristics. In this manner, the heterojunction FET shown in FIG. 2 has good characteristics and is effectively used as a high-output element of a microwave or millimeter wave band.

Various modifications of the first embodiment may be made.

The n-InP layer 230 and the n-InP layer 250 have thicknesses large enough to supply the two-dimensional electrons to the undoped InGaAs layer 240, and to cause electrons moved from the undoped InGaAs layer 240 to remain in the InP layers and the undoped AlInAs layer 120 to sufficiently function as a heterobarrier. Therefore, the thickness of the n-InP layer 230 or the n-InP layer 250 can fall within the range of about 10 nm to 50 nm.

When the undoped InGaAs layer 240 is excessively thin, the two-dimensional electron gas cannot be stored therein. However, when the thickness of the undoped InGaAs layer 240 is excessively large, the distance between the gate and the channel is undesirably increased to degrade the device characteristics. Therefore, the undoped InGaAs layer 240 has a thickness falling within the range of about 5 nm to 15 nm.

Since the undoped AlInAs layer 120 is formed to function as a heterobarrier and to prevent adverse influence on the operation of the device, the undoped AlInAs layer 120 may be replaced with another layer having a large band gap.

The undoped AlInAs layer 120 has a thickness large enough to prevent entry of an impurity from the semi-insulating InP substrate 110 and relax distortion of the substrate interface. When the thickness of the undoped AlInAs layer 120 is excessively large, however, it growth is time-consuming. The undoped AlInAs layer 120 preferably has a thickness falling within the range of about 100 nm to 600 nm.

Since the undoped AlInAs layer 120 is formed to function as a heterobarrier and to prevent adverse influence on the operation of the device, the undoped AlInAs layer 120 may be replaced with another layer having a large band gap.

The AlInAs layer 160 has a thickness to form a good Schottky junction. If the thickness of the AlInAs layer 160 is small, the FET characteristics are degraded by a tunneling effect. However, if the thickness of the AlInAs layer 160 is large, the distance between the gate and the channel is increased to decrease a transconductance gm. Therefore, the AlInAs layer 160 preferably has a thickness falling within the range of 10 nm to 30 nm.

Although the AlInAs layer 160 consists of an undoped compound, an n-type compound (e.g., an impurity concentration of $5 \times 10^{17}/cm^3$) may be used to reduce the ohmic contact resistance. In addition, an anti-oxidant surface protective layer (e.g., an InGaAs layer) may be formed on the AlInAs layer 160.

Ti/Pt/Au is used as the material of the gate electrode 420 because Ti can form a good Schottky junction with GaAs and has a low resistance. However, Mo/Au, Ti/Pd/Au, W/Au, or WSi/Au may be used.

AuGe/Ni is used as the material of the source electrode 410 and the drain electrode 430 because a minimum contact resistance can be obtained. However, PdGe/Au, or AuGe/Ag/Ni may be used.

The second embodiment of the present invention will be described with reference to the accompanying drawings. The same reference numerals as in the conventional example denote the same in the second embodiment, and a detailed description thereof will be omitted or a brief description will be made.

Figure 5:
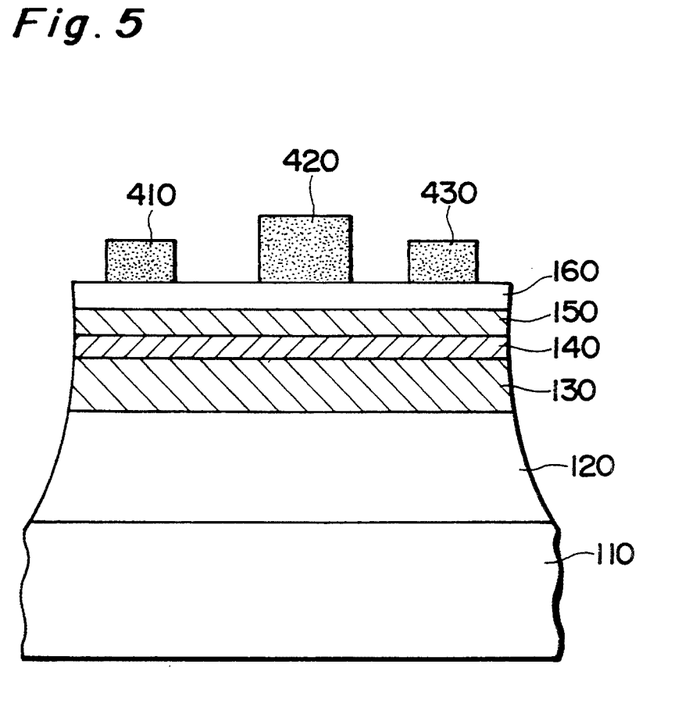
FIG. 5 is a sectional view showing a structure according to the second embodiment of the present invention.

FIG. 5 shows a structure of a heterojunction FET (MESFET) according to the second embodiment of the present invention. In this FET, an undoped AlInAs layer 120, an undoped InP layer 130, an n-InGaAs layer 140 ($In_xGa_{1-x}As$), an undoped InP layer 150, and an AlInAs layer 160 are sequentially grown on a semi-insulating InP substrate 110. A source electrode 410, a drain electrode 430, and a gate electrode 420 are formed on the AlInAs layer 160.

Figure 6A:
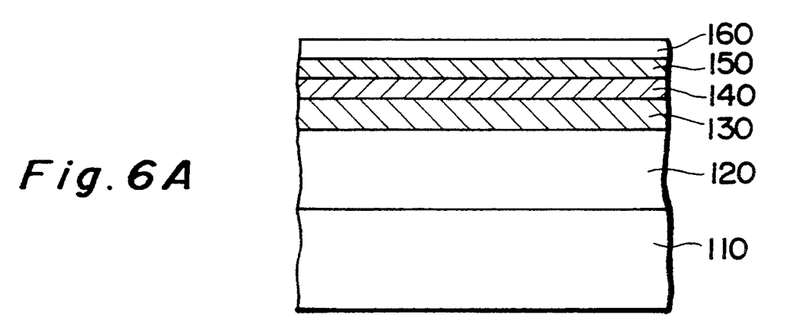
FIGS. 6A to 6C are sectional views for explaining the steps in manufacturing the structure of the second embodiment.

This heterojunction FET is manufactured by the steps in FIGS. 6A to 6C, as will be described below.

The undoped AlInAs layer 120 of an epitaxial layer, the n-InP layer 130, the undoped InGaAs layer 140, the n-InP layer 150, and the AlInAs layer 160 are sequentially grown on the semi-insulating InP substrate 110 in accordance with molecular beam epitaxy (MEB) or metal organic vapor phase epitaxy (MOVPE). The undoped AlInAs layer 120 has a thickness of 300 nm. The undoped InP layer 130 has a thickness of 30 nm. The n-InGaAs layer 140 has a thickness of 10 nm and a carrier concentration of $5 \times 10^{18}/cm3$. When the channel electric field is high, the thickness of the n-InGaAs layer 140 is sufficiently small such that the number of electrons moved to the undoped InP layers 130 and 150 cannot be ignored, and the electron density of the n-InGaAs layer 140 is large enough to obtain a sufficiently high drain current.

The undoped InP layer 150 has a thickness of 10 nm. The thicknesses of the undoped InP layers 130 and 150 are large enough to cause the electrons from the n-InGaAs layer 140 to travel. The undoped InP layer 130 has an electron density small enough to obtain a good Schottky junction. The thickness of the AlInAs layer 160 is 15 nm (FIG. 6A).

Figure 6B:
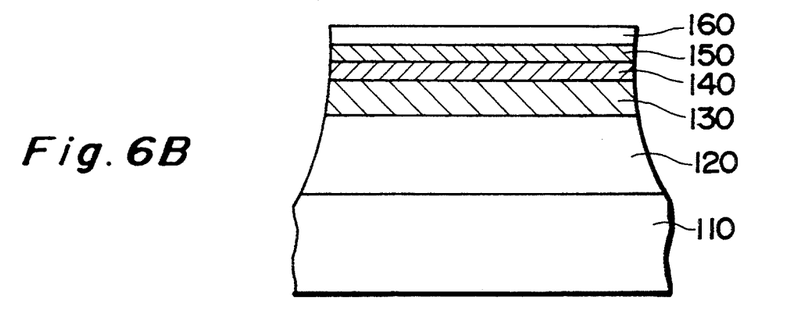
Figure 6C:
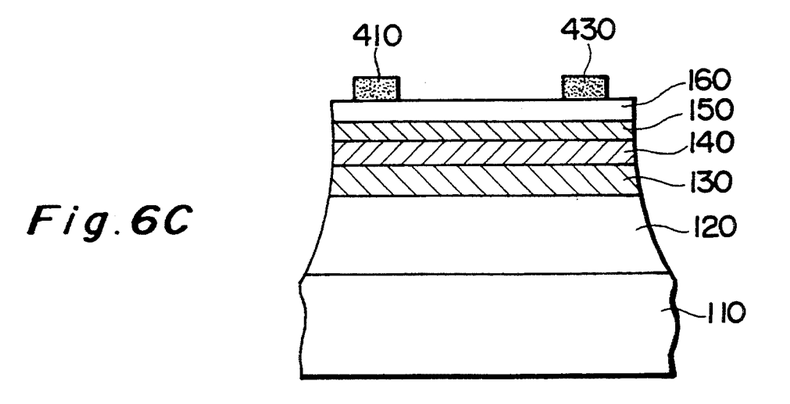

Mesa etching is performed using a resist as a mask to perform electrical isolation of active regions, i.e., isolation between the elements (FIG. 6B). A resist film is deposited on the entire surface and is patterned to form openings at locations corresponding to the prospective source and drain electrodes (this is performed by normal photolithography). Thereafter, AuGe/Ni (100 nm/30 nm) is vacuum-deposited and is lifted off using the resist pattern, thereby forming the source electrode 410 and the drain electrode 430 (FIG. 6C).

After a resist is deposited on the entire surface and is patterned to form an opening at a location corresponding to the prospective gate electrode, Ti/Pt/Au (30/10/300 nm) is vacuum-deposited. Thereafter, Ti/Pt/Au is lifted off using the pattern of the resist, thereby obtaining a heterojunction FET shown in FIG. 5.

In the FET shown in FIG. 5, the source electrode 410 and the drain electrode 430 are in ohmic contact with the AlInAs layer 160, and the gate electrode 420 forms a Schottky junction with the AlInAs layer 160. The undoped AlInAs layer 120 forms a heterobarrier with respect to the undoped InP layer 130 to prevent electrons from leaking from the undoped InP layer 130 to the semi-insulating InP substrate 110. InP is a material which hardly forms a good Schottky junction. For this reason, the AlInAs layer 160 is formed to form a good Schottky junction with the gate electrode 420.

Figure 7A:
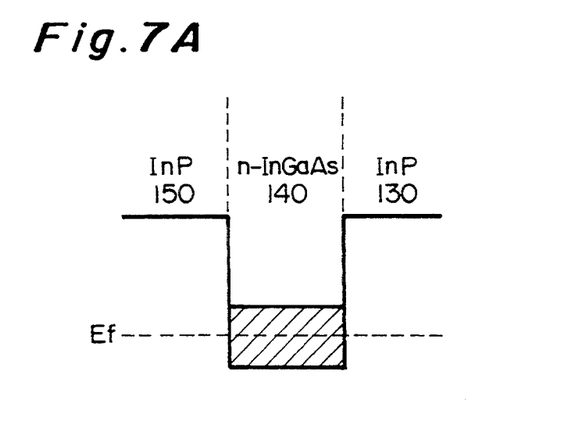
FIGS. 7A and 7B are potential diagrams near the channel.
Figure 7B:
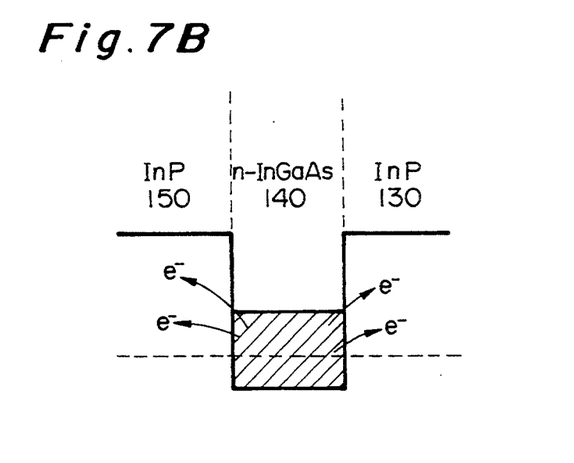

The band structure of the conduction bands of the undoped InP layer 130, the n-InGaAs layer 140, and the undoped InP layer 150 is a structure having barriers shown in FIGS. 7A and 7B. A current flowing through the n-InGaAs layer 140 having a low potential of the conduction band in a low electric field is a dominant current flowing between the drain and the source (FIG. 7A). The n-InGaAs layer 140 serves as a channel. In a high electric field, part of this current runs over the barrier and flows on the side of the undoped InP layers 130 and 150. This current component flows in the InP layers 130 and 150 (FIG. 7B) and a region serving as the channel is spread. Since InGaAs and InP have a high electron saturation rate, the average traveling time of the electrons is short in a low electric field. Even if some electrons flow in the InP layers 130 and 150 in a high electric field, prolongation of the average traveling time can be suppressed. That is, the average traveling time is short regardless of a change in channel region caused by a change in magnitude of the electric field. Therefore, a high-speed operation can be performed and good frequency characteristics can be obtained regardless of the bias conditions.

In particular, the n-InGaAs layer has a small thickness such that the number of electrons moved to the InP layer cannot be ignored. However, since the n-InGaAs layer 140 serving as the channel has a high electron density, it has a low source parasitic resistance and a high current driving capacity and can process a higher power. In addition, since the thicknesses of the undoped InP layer 150 and the AlInAs layer 160 near the surface are small, the distance between the n-InGaAs layer 140 and the gate electrode 420 is small, and good cutoff characteristics can be obtained. In this manner, the heterojunction FET shown in FIG. 5 can have good characteristics and can be effectively used for a high-output element of a microwave or millimeter wave band.

In the prior art FET described in "IEEE ELECTRON DEVICE LETTERS. Vol. 9, No. 7, July 1988", since the layers sandwiching the InGaAs layer are AlInAs layers having poor electron transport characteristics (i.e., a low mobility and low saturation rate), when a high electric field is applied to the channel, electrons in the channel run over the barrier having an energy, thereby degrading the FET characteristics.

To the contrary, according to the present invention, since the layers defining the channel therebetween are InP layers having good electron transport characteristics, degradation of the characteristics can be prevented even if a high electric field is applied to the channel.

Various modifications can be made in this embodiment.

For example, as for the thickness of the undoped InGaAs layer 140, if it is selected such that the number of electrons emitted from the Undoped InGaAs layer 140 ($In_xGa_{1-x}As$) is sufficiently increased, an advantage obtained by formation of the InP layers 130 and 150 can be obtained. The undoped InGaAs layer 140 therefore preferably has a thickness falling within the range of about 5 nm to 15 nm.

The InP layer (undoped InP layer 150) on the substrate side preferably has a minimum carrier concentration and has a thickness large enough to cause the moving electrons to travel. The InP layer (undoped InP layer 130) on the surface side may be an n-type (e.g., an impurity concentration of $5 \times 10^{17}/cm^3$) layer to reduce the source resistance. Each of the InP layers 130 and 150 has a thickness not to cause moving electrons to reach the AlInAs layer 160 and to allow the undoped AlInAs layer 120 to sufficiently function as a heterobarrier. Therefore, this thickness preferably falls within the range of about 10 nm to 50 nm.

Since the undoped AlInAs layer 120 is formed to function as a heterobarrier and to prevent adverse influence on the operation of the device, as in the above embodiment, the undoped AlInAs layer 120 may be replaced with another layer having a large band gap. Therefore, the undoped AlInAs layer 120 preferably has a thickness falling within the range of about 100 nm to 600 nm.

The AlInAs layer 160 has a thickness to form a good Schottky junction as in the above embodiment. If the thickness of the AlInAs layer 160 is small, the FET characteristics are degraded by a tunneling effect. However, if the thickness of the AlInAs layer 160 is large, the distance between the gate and the channel is increased to decrease a transconductance gm. Therefore, the AlInAs layer 160 preferably has a thickness falling within the range of 10 nm to 30 nm.

The AlInAs layer 160 consists of an undoped compound, but may consist of an n-type (e.g., an impurity concentration of $5 \times 10^{17}/cm^3$) compound. In addition, an antioxidant surface protective layer (e.g., an InGaAs layer) may be formed on the AlInAs layer 160.

The arrangements and structures of the gate electrode 420, the source electrode 410, and the drain electrode 430 are the same as those in the above embodiment.

In addition, since the undoped AlInAs layer 120 is formed to function as a heterobarrier and to prevent adverse influence on the operation of the device, it may be replaced with another layer having a large band gap.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. A field effect transistor in which a current flowing between a drain region and a source region is controlled by a voltage applied to a gate electrode, said field effect transistor comprising:
    a buffer layer; and
    a channel region formed on said buffer layer and made up of a multi-layer structure, said multi-layer structure including
    a lower electron supply layer consisting of a first compound semiconductor which is formed of a material different from that of said buffer layer, said lower electron supply layer being formed directly on said buffer layer;
    a channel formation semiconductor layer consisting of an undoped second compound semiconductor formed directly on said lower electron supply layer; and
    an upper electron supply layer consisting of said first compound semiconductor formed directly on said channel formation semiconductor layer; whereby when a voltage is supplied to said gate electrode, channels are formed in said channel formation semiconductor layer, and electrons for said channel formation semiconductor layer are furnished by real space transition flow through said lower and said upper electron supply layers.

2. A field effect transistor according to claim 1, further comprising:
    a first semiconductor layer contacting said upper electron supply layer of said channel region and forming a potential barrier in an interface with said upper electron supply layer; and
    a second semiconductor layer contacting said lower electron supply layer of said channel region and forming a potential barrier in an interface with said lower electron supply layer.

3. A field effect transistor according to claim 2, wherein
    said channel region is formed over a semi-insulating semiconductor substrate consisting of a third compound semiconductor.

4. A field effect transistor according to claim 3, wherein
    said first semiconductor layer has a planar structure at a part thereof which is directly in contact with said gate electrode.

5. A field effect transistor according to claim 2, wherein
    said first compound semiconductor includes a compound semiconductor doped with a n-typed impurity, and
    said first compound semiconductor has a sufficient electron saturation rate such that mobility is equivalent to that of a two-dimensional electron gas formed in said channel formation semiconductor layer.

6. A field effect transistor according to claim 5, wherein
    when a voltage is supplied to said gate electrode, a first channel is a two,dimensional electron gas formed in an upper region of said channel formation semiconductor layer, and a second channel is a two-dimensional electron gas formed in a lower region of said channel formation semiconductor layer;
    said first channel being supplied electrons from said upper electron supply layer, and said second channel being supplied electrons from said lower electron supply layer.

7. A field effect transistor according to claim 2, wherein
    each of said lower and upper electron supply layers has a thickness sufficient to allow electron flow therein; and
    said electrons from said channel formation semiconductor layer being created by the real space transition.

8. A field effect transistor according to claim 7, wherein
    said upper electron supply layer has an electron supply density sufficient to form a Schottky junction with said gate electrode.

9. A field effect transistor in which a current flowing between a drain region and a source region is controlled by a voltage applied to a gate electrode, said field effect transistor comprising:
    an AlInAs buffer layer; and
    a channel region formed on said buffer layer and made up of a multi-layer structure, said multi-layer structure including
    a lower InP layer formed directly on said buffer layer,
    an undoped InGaAs layer formed directly on said lower InP layer, and
    an upper InP layer formed directly on said undoped InGaAs layer, said undoped InGaAs layer being sandwiched between said lower and upper InP layers.

10. A field effect transistor according to claim 9, further comprising:
   a first semiconductor layer contacting said upper InP layer of said channel region and forming a potential barrier at an interface with said upper InP layer; and
   a second semiconductor layer contacting said lower InP layer of said channel region and forming a potential barrier at an interface with said lower InP layer.

11. A field effect transistor according to claim 10, wherein
   said channel region is formed over a semi-insulating InP substrate.

12. A field effect transistor according to claim 11, wherein
   said first semiconductor layer has a planar structure at a part thereof which is in direct contact with said gate electrode.

13. A field effect transistor according to claim 9, wherein
   each of said lower and upper InP layers includes a n-type InP.

14. A field effect transistor according to claim 13, wherein
   when a voltage is supplied to said gate electrode, a first channel is a two-dimensional electron gas formed in an upper region of said undoped InGaAs layer, and a second channel is a two-dimensional electron gas formed in a lower region of said undoped InGaAs layer;
   said first channel is supplied electrons from said upper InP layer, and said second channel is supplied electrons from said lower InP layer.

15. A field effect transistor according to claim 10, wherein said first semiconductor layer includes AlInAs.

16. A field effect transistor according to claim 13, wherein said undoped InGaAs layer has a thickness of 5 to 15 nm.

17. A field effect transistor according to claim 13, wherein
   each of said lower and upper InP layers has a thickness of 10 to 50 nm.

18. A field effect transistor according to claim 12, wherein
   said first semiconductor layer has a thickness of 10 to 30 nm.

19. A field effect transistor according to claim 9, wherein said second semiconductor layer has a thickness of 100 to 600 nm.

20. A field effect transistor according to claim 9, wherein
   said upper InP layer has a thickness sufficient for electrons to flow therein;
   said electrons from said undoped InGaAs layer occurring due to real space transition.

21. A field effect transistor according to claim 9, wherein
   said upper InP layer has an electron density sufficient to form a Schottky junction with said gate electrode.

22. A field effect transistor in which a current flowing between a drain region and a source region is controlled by a voltage applied to a gate electrode, said field effect transistor comprising:
   a buffer layer; and
   a channel region formed on said buffer layer and made up of a multi-layer structure, said multi-layer structure including:
   a lower electron supply layer consisting of a first compound semiconductor which is formed of a material different than that of said buffer layer, said lower electron supply layer being formed directly on said buffer layer;
   a channel formation semiconductor layer consisting of an undoped second compound semiconductor formed directly on said lower electron supply layer; and
   an upper electron supply layer consisting of said first compound semiconductor formed directly on said channel formation semiconductor layer, said channel formation semiconductor layer being sandwiched between said lower and upper electron supply layers, whereby
   said first compound semiconductor has a sufficient electron saturation rate such that said first compound semiconductor has a mobility equivalent to that of a two-dimensional electron gas formed in said channel formation semiconductor layer.

23. A field effect transistor according to claim 22, further comprising:
   a first semiconductor layer formed on and contacting said upper electron supply layer of said channel region and forming a potential barrier at an interface with said upper electron supply layer; and
   a second semiconductor layer formed on and contacting said lower electron supply layer of said channel region and forming a potential barrier at an interface with said lower electron supply layer.

24. A field effect transistor according to claim 23, wherein
   said channel region is formed over a semi-insulating semiconductor substrate consisting of a third compound semiconductor.

25. A field effect transistor according to claim 23, wherein
   said first semiconductor layer has a planar structure at a part thereof which is in direct contact with said gate electrode.

26. A field effect transistor according to claim 22, wherein
   said first compound semiconductor includes a compound semiconductor doped with an n-type impurity.

27. A field effect transistor according to claim 22, wherein
   when a voltage is supplied to said gate electrode, a first channel comprises a two-dimensional electron gas formed in an upper region of said channel formation semiconductor layer, and a second channel comprises a two-dimensional electron gas formed in a lower region of said channel formation semiconductor layer;
   said first channel being supplied electrons from said upper electron supply layer, and said second channel being supplied electrons from said lower electron supply layer.

28. A field effect transistor according to claim 27, wherein
   each of said lower and upper electron supply layers has a thickness sufficient to allow electron flow therein; and
   said electrons from said channel formation semiconductor layer being created by real space transition.

29. A field effect transistor according to claim 28, wherein
   said upper semiconductor layer has an electron density sufficient to create a Schottky junction with said gate electrode.

* * * * *